(12) United States Patent
Tomerlin et al.

(10) Patent No.: US 7,254,208 B2
(45) Date of Patent: Aug. 7, 2007

(54) DELAY LINE BASED MULTIPLE FREQUENCY GENERATOR CIRCUITS FOR CDMA PROCESSING

(75) Inventors: Andrew Tomerlin, Coral Springs, FL (US); Robert E. Stengel, Pompano Beach, FL (US)

(73) Assignee: Motorola, Inc., Schaumburg, IL (US)

( * ) Notice: Subject to any disclaimer, the term of this patent is extended or adjusted under 35 U.S.C. 154(b) by 322 days.

(21) Appl. No.: 10/441,333

(22) Filed: May 20, 2003

(65) Prior Publication Data

US 2004/0234017 A1  Nov. 25, 2004

(51) Int. Cl.
*H03D 3/24* (2006.01)
(52) U.S. Cl. .................. 375/373; 327/122; 327/147
(58) Field of Classification Search ............ 375/214, 375/373, 376; 327/119, 147, 153, 150
See application file for complete search history.

(56) References Cited

U.S. PATENT DOCUMENTS

| | | | |
|---|---|---|---|
| 4,845,390 A * | 7/1989 | Chan ........................... | 327/278 |
| 5,684,434 A | 11/1997 | Mann et al. | |
| 5,774,703 A | 6/1998 | Weiss et al. | |
| 5,922,076 A | 7/1999 | Garde | |
| 5,963,069 A | 10/1999 | Jefferson et al. | |
| 6,091,760 A | 7/2000 | Giallorenzi et al. | |
| 6,141,374 A | 10/2000 | Burns | |
| 6,147,531 A * | 11/2000 | McCall et al. ............... | 327/158 |
| 6,163,224 A * | 12/2000 | Araki et al. .................. | 331/34 |
| 6,259,283 B1 | 7/2001 | Nguyen | |
| 6,272,646 B1 | 8/2001 | Rangasayee et al. | |
| 6,282,627 B1 | 8/2001 | Wong et al. | |
| 6,353,649 B1 | 3/2002 | Bockleman et al. | |
| 6,480,045 B2 * | 11/2002 | Albean ........................ | 327/119 |
| 6,538,489 B2 | 3/2003 | Nakano | |
| 6,686,805 B2 | 2/2004 | Cyrusian | |
| 6,784,707 B2 | 8/2004 | Kim et al. | |
| 6,794,913 B1 | 9/2004 | Stengel | |
| 2003/0014682 A1 | 1/2003 | Schmidt | |
| 2003/0152181 A1 | 8/2003 | Stengel et al. | |

* cited by examiner

*Primary Examiner*—Kevin Kim

(57) ABSTRACT

A frequency extension circuit, consistent with certain embodiments of the present invention has a first delay line (108) having a plurality of taps. The delay line receives a reference clock at an input with a clock rate of $F_{REF}$. A second delay line (104, 150) also receives the reference clock at an input. A logic circuit (130, 134, ..., 138, 140) combines signals from the delay line taps of the first delay line (108) with signals from the delay line taps of the second and/or first delay line (104, 150, 108) to produce a collection of clock pulses having a combined clock rate of $F_{REF}*2N$. At least one of the delay lines can be locked to the reference clock using a delay locked loop. The clock pulses can be logically combined with a seed register (204) contents to produce a recursive sequence or with data for convolutional encoding, or with pilot data for correlation in a CDMA transceiver.

12 Claims, 4 Drawing Sheets

DELAY LINE BASED MULTIPLE FREQUENCY GENERATOR CIRCUITS FOR CDMA PROCESSING

FIELD OF THE INVENTION

This invention relates generally to the field of frequency extension using delay line based circuits. More particularly, in certain embodiments consistent with the present invention, this invention relates to circuits using a delay line based multiple frequency generator particularly useful in CDMA (Code Division Multiple Access) transmitters and receivers.

BACKGROUND OF THE INVENTION

The air interface specification for many CDMA transceivers can be quite complex. Most currently available Digital Signal Processors (DSP) either consume too much power, or they do not have enough correlation capacity for chip level processing. This is especially important for battery powered devices, since the power consumed directly relates to the battery life and frequency of charging or battery replacement. As the requirements for more and more processing power increase, this problem is compounded. This is especially true for high frequencies of operation dictated by high data rates, such as those specified for the third generation (3G) and beyond for CDMA, where these issues present significant obstacles to designers.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
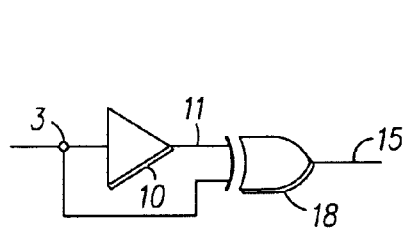
FIG. 1 is a schematic diagram of a pulse generator useful in the frequency extension circuitry consistent with certain embodiments of the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding elements in the several views of the drawings.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically. The term "program", as used herein, is defined as a sequence of instructions designed for execution on a computer system. A "program", or "computer program", may include a subroutine, a function, a procedure, an object method, an object implementation, in an executable application, an applet, a servlet, a source code, an object code, a shared library/ dynamic load library and/or other sequence of instructions designed for execution on a computer system.

In certain embodiments consistent with the present invention, a concept referred to as "frequency extension" is utilized to facilitate high frequency processing while minimizing power consumption. This concept is used in conjunction with multiple clock signal generation, recursive sequence generation, a correlator circuit and a convolutional encoder, all of which may be useful in a low power consumption CDMA transceiver as well as in other applications.

Frequency Extension

Figure 2:
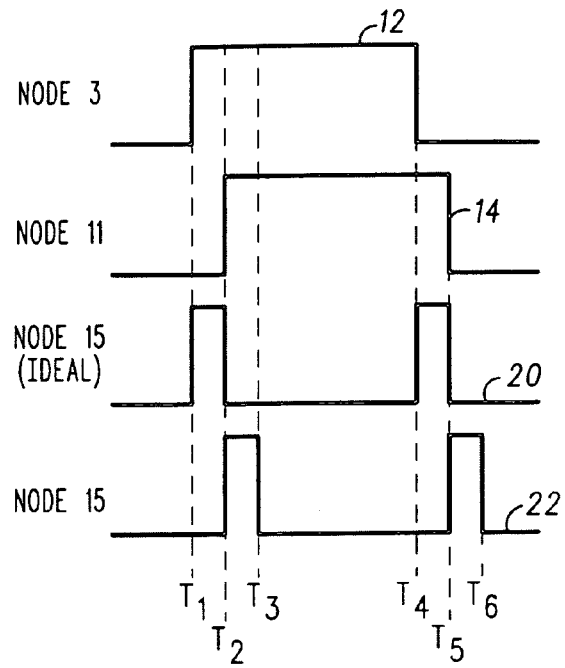
FIG. 2 is a timing diagram illustrating operation of the pulse generator of FIG. 1 and consistent with certain embodiments of the present invention.

Turning now to FIG. 1, viewed in conjunction with FIG. 2, an elementary process used in frequency extension is depicted in order to provide a clear understanding of the frequency extension process used herein. A reference clock input signal $F_{REF}$ is applied to the input node 3 of a buffer 10. A slightly delayed version of the input signal to buffer 10 emerges at the output node 11 of buffer 10. This is depicted by curves 12 and 14 of FIG. 2, with rising edges occurring at times $T_1$ and $T_2$ respectively, and falling edges occurring at times $T_4$ and $T_5$ respectively. These curves are idealized in that the rise time and fall time of the signals approach zero in all cases. The input signal at node 3 as well as the output signal at node 11 can be applied to an EXCLUSIVE OR gate (XOR) 18 to produce a pulse at its output (node 15) having duration corresponding to the delay associated with the buffer. If the delay of XOR gate 18 can be ignored, curve 20 would depict the output at node 15. This idealized output is shown as curve 20 with rising edge at times $T_1$ and $T_4$ respectively and falling edge times $T_2$ and $T_5$ respectively. Curve 22 depicts a more realistic output taking the assumption that the delay of XOR gate 18 is identical to the delay of buffer 10 so that the rising edges appear at approximately time $T_2$ and $T_5$ respectively and falling edge times appear at approximately times $T_3$ and $T_6$ respectively. If the reference clock has a period greater than the buffer delay, the above arrangement can be extended to produce a sequence of clock signals that extend the frequency of the reference clock substantially (i.e., frequency extension). This principle is put to use in the multiple clock generator circuit of FIG. 3.

Multiple Clock Generator

Figure 3:
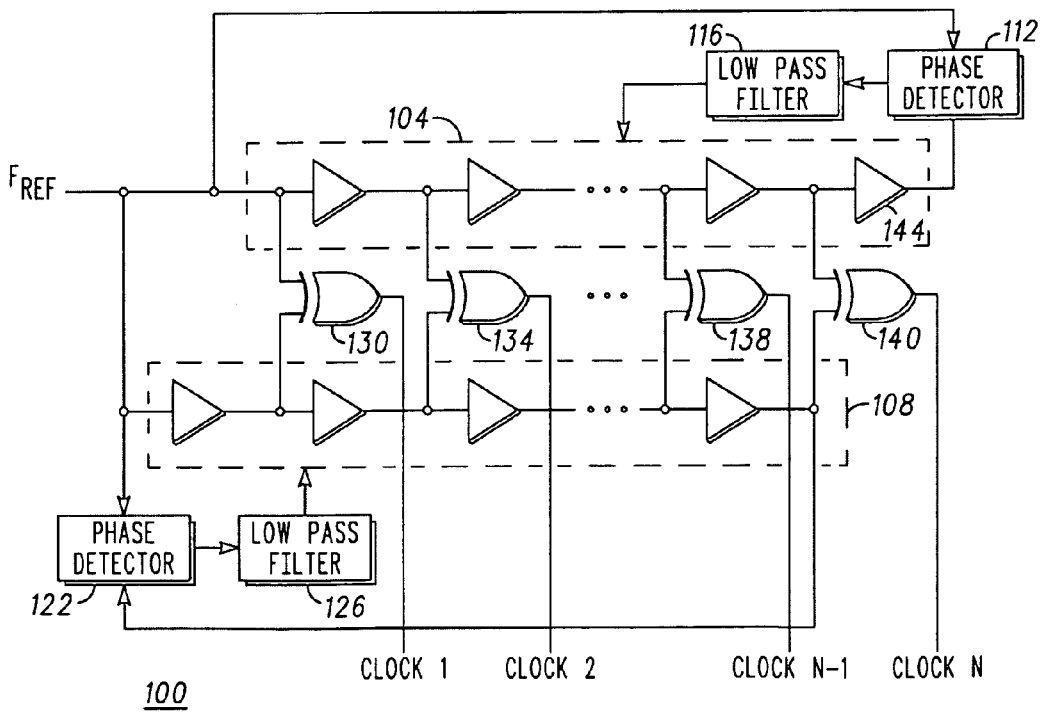
FIG. 3 is a schematic of a frequency extending multiple clock generator circuit consistent with certain embodiments of the present invention.

FIG. 3 depicts one implementation 100 of a frequency extending multiple clock generator circuit 100 that uses the above principle to extend the frequencies obtainable from a single lower frequency reference clock. Circuit 100 utilizes a pair of delay lines 104 and 108 configured as part of a pair of delay locked loops (DLL). Each of delay lines 104 and 108 are made up of a plurality of N series connected buffers that are locked to the reference clock $F_{REF}$. The locking is carried out using a delay locked loop arrangement. The final output of delay line 104 is compared with the input reference clock $F_{REF}$ at a phase detector 112. The phase detector 112 output is low-pass filtered at 116 and the output of filter 116 is used to control the overall delay of the delay line 104 in a feedback control system. In accordance with the present exemplary embodiment, the delay line 108 is locked in a similar manner to $F_{REF}$ in a DLL using phase detector 122 and low-pass filter 126.

Delay lines 104 and 108 are depicted to both be N stages in length with N buffers. Each of the buffers has an output and an input that are available at "taps" along the delay lines. In accordance with this exemplary embodiment, the input of the first delay element (buffer) of delay line 104 and the output of the first delay element of delay line 108 are added together at XOR gate 130 to produce an output signal CLOCK 1 comprising a pulse occurring approximately one buffer delay after the rising edge of reference clock $F_{REF}$ (ignoring the delay of the XOR gate which can be readily taken into consideration as necessary or ignored if appropriate). In a similar manner, the input of the second delay element (buffer) of delay line 104 and the output of the second delay element of delay line 108 are added together at an XOR gate 134 to produce an output signal CLOCK 2 in the form of a pulse occurring approximately two buffer delays after the rising edge of reference clock $F_{REF}$. This sequence of processing continues until the input of the N-1 delay element (buffer) of delay line 104 and the output of the N-1 delay element of delay line 108 are added together at an XOR gate 138 to produce an output signal CLOCK N-1 and the input of the Nth delay element (buffer) of delay line 104 and the output of the Nth delay element of delay line 108 are added together at an XOR gate 140 to produce an output signal CLOCK N in the form of a pulses occurring at approximately N-1 and N buffer delays after the rising edge of reference clock $F_{REF}$. In this manner, N clock signals can be produced at each rising and falling edge of the reference clock which collectively extend the frequency of the reference clock $F_{REF}$ by a factor of 2N. By use of DLL technology, the accuracy of the clock signals is maintained by the locking of the delays to the reference clock $F_{REF}$.

It should be noted that FIG. 3 is intended to depict delay lines 104 and 108 as being the same length (N buffers each). However, the last buffer 144 is not actually used for frequency extension in this exemplary embodiment. This buffer 144, however, may be included in order to facilitate locking the delay line 104 to $F_{REF}$ in the delay locked loop circuit (including phase detector 112 and low pass filter 116) so that the delays associated with the buffers of delay line 104 are locked to the same delay as the buffers of delay line 106. In other words, if both delay lines 104 and 106 have the same number N of delay elements (buffers) and both are locked to the same reference clock ($F_{REF}$), then each buffer will have approximately the same time delay associated therewith (approximately $1/(N*F_{REF})$). However, in other embodiments, delay line 104 may have one fewer delay elements than delay line 108 without departing from the invention.

Figure 4:
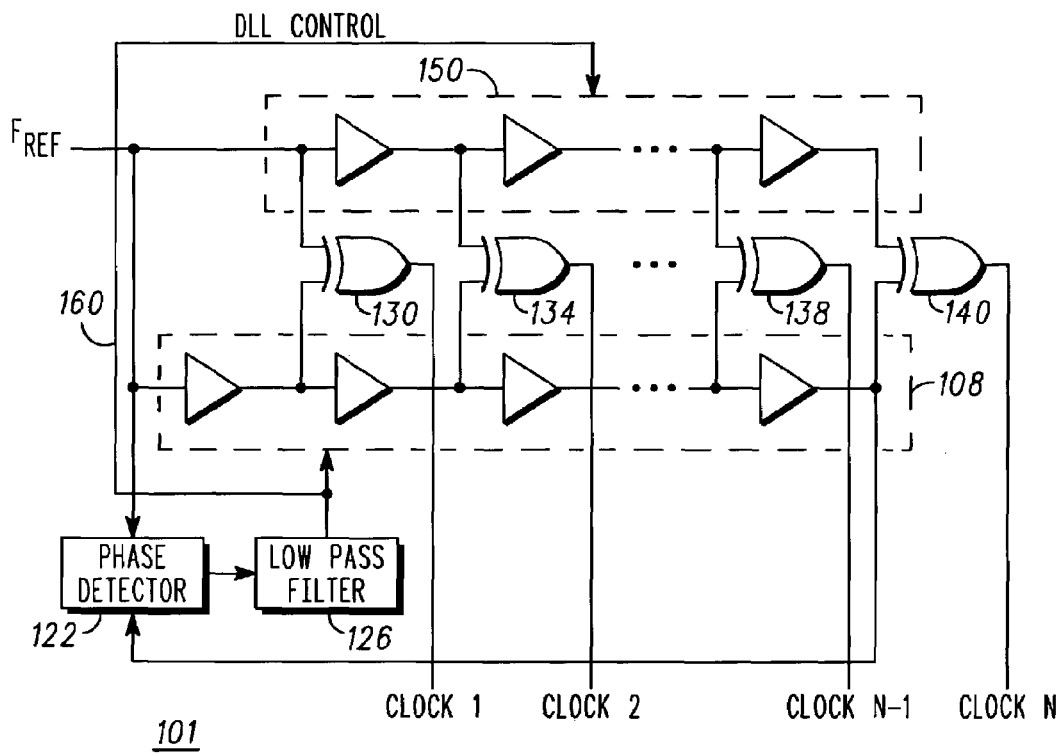
FIG. 4 is a schematic of an alternative embodiment of a frequency extending multiple clock generator circuit consistent with certain embodiments of the present invention.

The frequency extension concept can similarly be utilized in many other embodiments to produce an extension of the reference clock. FIG. 4 depicts a simplified version 101 of the frequency extending multiple clock generator of FIG. 3. In this example, like reference numbers designate identical components as those shown in FIG. 3. However, delay line 104 is replaced with delay line 150 which has N-1 delay elements. Owing to the different number of delay elements, delay line 150 is not locked to $F_{REF}$ by virtue of its own delay locked loop circuitry. Instead, delay line 150 receives the same control voltage 160 (or other control signal) from low pass filter 126 to control the overall delay of the delay line. If the buffer delay elements of delay line 150 are as nearly identical as possible to those of delay line 108, and receive the same control signal 160 (e.g., a voltage controlling a current source or charge pump associated with each delay element), then each delay element of delay line 150 will have a near identical delay to each delay element of delay line 108.

The frequency extender/multiple clock generator can also appropriately combine the taps of one delay buffer. If the inputs of the XOR gates 130, 134,138, and 140 are subsequent taps from the same delay line (for example delay line 108) then the outputs of the XOR gates would produce the same frequency extended clock pulse found in versions 100 and 101. In this embodiment, taps 0 and 1 from 108 provide inputs into XOR 130, taps 1 and 2 from 108 provide inputs into XOR 134, and so forth. Thus the frequency extender/multiple clock generator can be generalized to process taps from one or two delay lines.

To those skilled in the art, it is easily seen that XOR gates 130,134,138 and 140 can be replaced with other combinational logic to produce a high frequency clock pulse propagated at multiples of $N*F_{REF}$ across the delay line. For example, if XOR gates 130,134,138, and 140 are replaced with AND gates with one input inverted; then a clock pulse is formed with a rate of $N*F_{REF}$ propagating across the delay line.

Thus, the current embodiment of a frequency extender/multiple clock generator 100 uses the two offset delay lines as shown. The reference clock signal, $F_{REF}$, is fed into each delay line. The taps of each delay buffer are appropriately combined with taps from one or both delay lines with combinational logic (e.g. XOR'ed or AND'ed) to produce a high frequency clock pulse propagated at a multiple of $N*F_{REF}$ rate across the delay line.

In certain embodiments consistent with the present invention as illustrated, buffers are used for delay elements. These buffers may be, for example, fabricated from a pair of series connected CMOS (Complimentary Metal Oxide Semiconductor) inverters. The delay time of the delay line can be controlled by modifying the drive signal to current sources or charge pumps that supply current to the buffers. In other embodiments other types of delay elements may similarly be used without departing from the invention.

Thus, a frequency extension circuit, consistent with certain embodiments of the present invention has a first delay line having a plurality of taps. The delay line receives a reference clock at an input with a clock rate of $F_{REF}$. A second delay line also receives the reference clock at an input. A logic circuit combines signals from the delay line taps of the first delay line with signals from the delay line taps of the second and/or first delay line such that the $n^{th}$ tap of the first delay line is combined with the n-$1^{st}$ tap of the second and/or first delay line for each of a plurality of N taps in the first delay line to produce a collection of clock pulses having a combined clock rate of $F_{REF}*2N$. At least one of the delay lines can be locked to the reference clock using a delay locked loop.

This multiple clock generation mechanism gives rise to several interesting circuit arrangements that are particularly useful in a high frequency, low current drain transceiver. In particular, the present arrangement can be advantageously applied to CDMA transceivers. Any such frequency extending multiple clock generator such as 100 or 101 can be used to realize the circuits to follow. Such circuits are generally designated 100 hereinafter, without intent of limitation.

Recursive Sequence Generator

Figure 5:
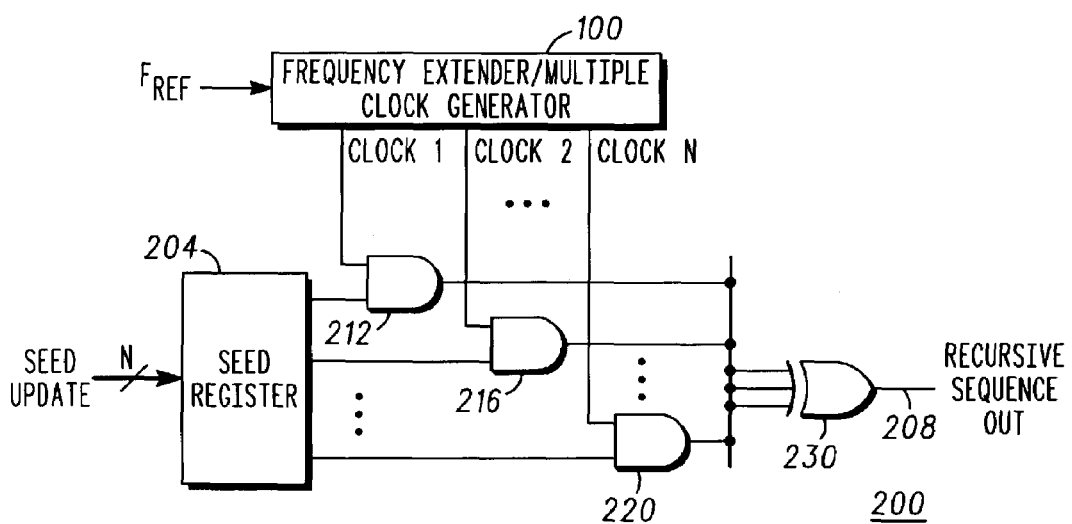
FIG. 5 is a recursive sequence generator consistent with certain embodiments of the present invention.

Recursive sequences and pseudorandom number (PN) sequences are used in CDMA transceivers. The above-described multiple clock generator and analogous circuits can be advantageously used in creation of such recursive sequences and PN sequences. FIG. 5 depicts an exemplary embodiment 200 of a recursive sequence generator using the above-described multiple clock generator to generate clock signals CLOCK 1 through CLOCK N. This embodiment is able to operate at high speeds with low current drain. A seed is stored in a seed register 204. This seed is then combined with the clock signals CLOCK 1 through CLOCK N using suitable logic gates to produce a recursive sequence out at 208. In the present embodiment, the least significant bit of the seed is applied to one input of AND gate 212 while CLOCK 1 is applied to the other input of AND gate 212. Similarly, the next-to-least significant bit of the seed is applied to one input of AND gate 216 while CLOCK 2 is applied to the other input of AND gate 216. This pattern repeats until the most significant bit of the seed is applied to one input of AND gate 220 while CLOCK N is applied to the other input of AND gate 220. The outputs of AND gates 212, 216 through 220 are then combined in an EXCLUSIVE OR gate 230 to produce the output 208 of the recursive sequence generator. The seed register 204 is updated according to the particular mathematical relations defining the recursive sequence. This is evident to those skilled in the art. The seed register is updated at the reference clock frequency $F_{REF}$.

It should be noted that although shown as AND gates, 212, 216 and 220 could be generalized to any random combinational logic operation or combination of logic operations without loss of generality. Similarly, other logical operations could be substituted for the EXCLUSIVE OR function of gate 230 without departing from the invention. Once a recursive sequence is generated it can, by itself be considered a PN sequence, or it can be logically combined with other recursive sequences or PN sequences in a known manner to produce a PN sequence with a specified characteristic.

The frequency extender/multiple clock generator 100 thus uses the two offset delay lines (or one delay line) with the reference clock signal, $F_{REF}$, fed into each delay line (or the one delay line). The taps of each delay buffer are appropriately combined with combinational logic (e.g. XOR'ed or AND'ed) to produce a set of high frequency clock pulses propagated at a $2*N*F_{REF}$ rate across the delay line. These pulses can be used to clock data out of the seed register 204 and both pulses and seed are appropriately combined with combinational logic (e.g. AND'ed) and added together (e.g., at an XOR gate) to produce a recursive sequence at a $2*N*F_{REF}$ rate.

Thus, in accordance with certain embodiments consistent with the present invention, a recursive sequence generator has a frequency extended multiple clock generator receiving a reference clock input signal and generating a plurality of N extended clock signals CLOCK 1 through CLOCK N therefrom. A seed register stores an N bit seed number and a combinational logic circuit that combines the N extended clock signals with the N bit seed number to produce a recursive sequence as an output thereof. The seed register is updated as needed according to the mathematical relations defining the recursive sequence.

CDMA Receiver

Figure 6:
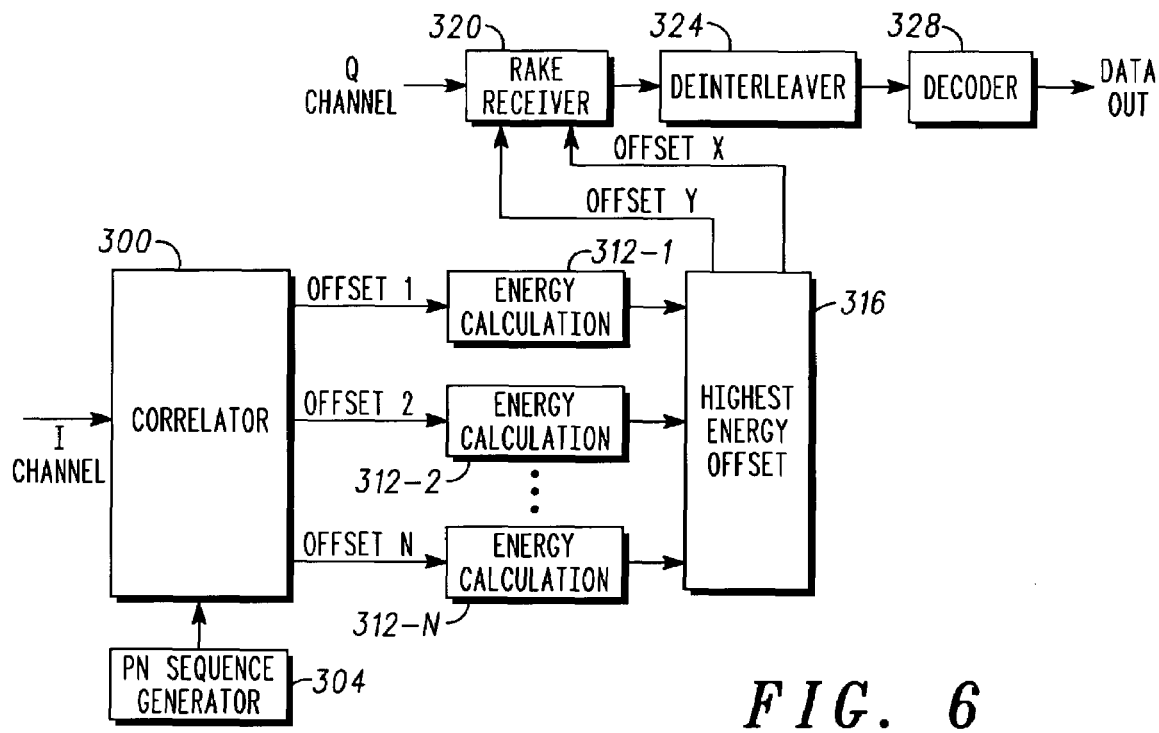
FIG. 6 is a block diagram of a portion of a CDMA transmitter consistent with certain embodiments of the present invention.

An exemplary CDMA receiver is depicted in the block diagram of FIG. 6. The receiver portion of FIG. 6 depicts receipt of a demodulated in-phase (I) channel and a quadrature (Q) channel of information. The I channel is used to carry pilot information and is applied to a correlator 300. Correlator 300 takes the received complex baseband data and correlates the received data with a PN sequence generated by PN sequence generator 304 (e.g., made up of one or more recursive sequences generated by circuitry such as 200). The correlator 300, as will be described in greater detail later, uses a delay line to implement a CDMA correlator using frequency extension to process baseband complex data and may do so at a very high rate (for example, >1 GHz). The correlator 300 outputs a set of time offset values (OFFSET 1 through OFFSET N). These time offset values are multiple time delayed versions of the same I channel data correlated with the PN sequence from PN sequence generator 304. The offset values, thus, represent multiple reflections of the input signals. The associated circuitry then determines which of the reflected values represents the two best quality signals, in this embodiment.

Each of the OFFSET values is passed to an energy calculator 312-1, 312-2 through 312-N. In certain embodiments, the energy calculator may be realized simply as an array of accumulators that operates to accumulate the input bits from each of the OFFSET values. These N parallel accumulators, accumulate the value of each offset to produce N energy estimates. From these accumulated values, or other energy estimate, the two offsets with the highest energy calculation value is determined at 316 and those two offsets (OFFSET X and OFFSET Y) are passed to a standard rake receiver 320 for use in processing incoming Q channel data. The rake receiver 320 operates to despread the two offsets and then combines them to create a received symbol. Rake receiver 320 may be a conventional rake receiver, for example, that takes the correlated data from the correlator 300, finds the highest energy peaks of that correlator data, then despreads the baseband data at the highest energy peaks to produce received encoded bits, or any other suitable receiver circuit. These encoded bits are passed to de-interleaver 324. The de-interleaver 324 reverses an interleaving process carried out in the transmitter side to reduce the effects of burst errors. The de-interleaved data are then passed to a decoder 328 (such as a hard decision or soft decision Viterbi decoder) and decodes the encoded bits to produce the received bit pattern.

Correlator Circuit

Figure 7:
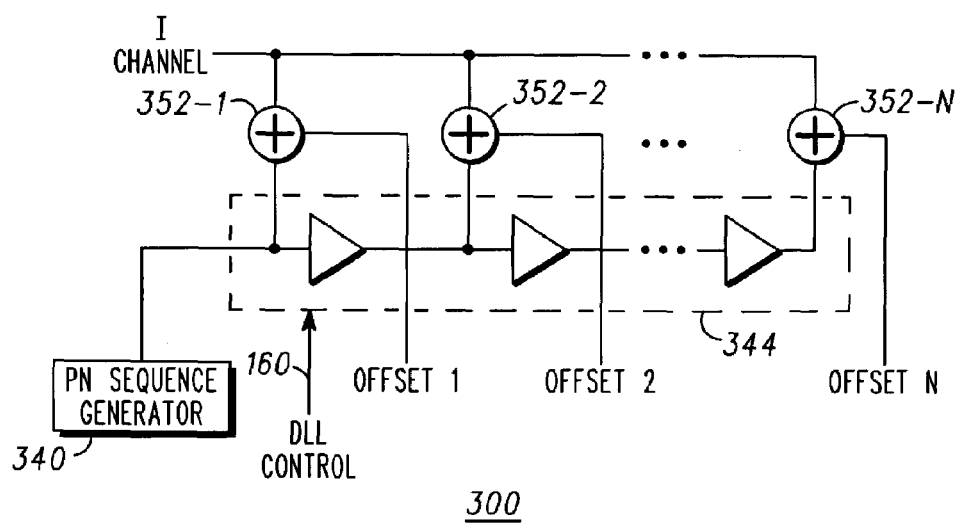
FIG. 7 is a circuit diagram of a correlator circuit as used in FIG. 6 and consistent with certain embodiments of the present invention.

In accordance with certain embodiments consistent with the present invention, a circuit architecture that uses frequency extension is used to perform a chip level correlation function. This architecture, in certain embodiments, allows for high frequency correlation (e.g., >1 GHz) while maintaining a low level of power drain. One embodiment of such an architecture is depicted in FIG. 7 as correlator 300. This architecture provides a low power solution that uses a delay line to perform the chip level processing.

In this exemplary embodiment, a PN sequence generator 340 (e.g., of the form shown in FIG. 5 or combinations thereof), provides an input to a delay line 344 that is locked with the same delay line/delay lock loop control 160 found in the PN sequence generator 340. Hence the delay line 344 runs at the same rate as the PN sequence. Each input or output tap from the delay line is added to the I channel data using a plurality of adders/descramblers 352-1, 352-2 through 352-N (e.g., a logic gate such as an XOR gate that applies the PN sequence to the I channel data for demodulation) to produce the plurality of OFFSET values OFFSET 1 thorough OFFSET N. These OFFSET values are then supplied to their respective accumulators as shown in FIG. 6.

Thus, a correlator circuit, consistent with certain embodiments of the present invention, has a delay line having an input and a plurality of N delay taps. A recursive sequence generator generates a recursive sequence and applies the recursive sequence to the input of the delay line to produce N delayed recursive sequences at the N delay taps of the delay line. A plurality of N logic circuits, each receive input data at a first input thereof and receive one of the N delayed recursive sequences at a second input thereof, wherein the N logic circuits each produce one of N offset outputs representing one of N possible time offset values.

This architecture allows for low power, high frequency correlation, advantageously using a delay line to assist in carrying out the correlation processing. The architecture uses delay line 344 to correlate complex baseband at high data rates and is capable of performing chip level processing at high rates (e.g., >1 GHz) in certain embodiments. The circuit configuration shown results in low power consumption, hence this solution is attractive for battery powered transceivers. This architecture can further provide an enabling technology for chip level processing on DSP's for infrastructure solutions and for ultra-wide band (UWB), to name but a few potential applications.

CDMA Transmitter

Figure 8:
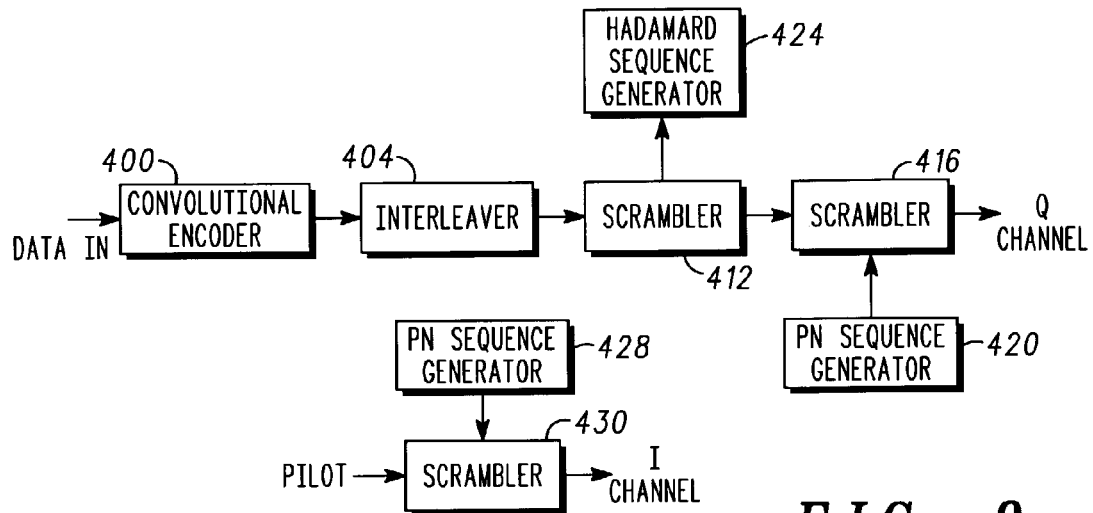
FIG. 8 is a block diagram of a portion of a CDMA receiver consistent with certain embodiments of the present invention.

FIG. 8 depicts an exemplary CDMA transmitter. This exemplary transmitter receives data to be transmitted at a convolutional encoder 400. Convolutional encoder 400 will be described in greater detail later, but generally speaking encodes the input data to produce convolutionally encoded data. Convolutional encoders, per se, are well known devices, but the current convolutional encoder 400 utilizes frequency extension techniques as will be described.

The output of convolutional encoder 400 is provided to an interleaver 404 that interleaves data in a manner that makes the data more immune to burst errors and adds redundancy to the data. In certain embodiments, interleaving involves rearranging the data so that data bits that are normally adjacent to one another are scattered among multiple error correction blocks of data. Thus, data errors resulting from short bursts of noise or short fades will produce scattered one or two bit errors per block that can be corrected by block error correction or other error correction techniques.

A Hadamard sequence generator 408 generates a Hadamard sequence in a known manner that is combined with the interleaved data from interleaver 404 at a scrambler 412. A Hadamard sequence generator generates one of a plurality of orthogonal sequences which are used to distinguish between each user in a particular communication system. The encoded data combined with the Hadamard sequence is then combined at scrambler 416 with a PN sequence generated by a PN sequence generator 420 made up of one or more recursive sequence generators 200, as previously discussed. The resulting data stream represents the Q channel data that can then be transmitted in a known manner.

The I channel is produced by generation of a pilot signal in any suitable known manner and combining the pilot with a PN sequence from another PN sequence generator 428 (or from PN sequence generator 420) at a scrambler 430. This pilot signal is used at the receiver as described above to characterize the channel for purposes of optimizing reception at the receiver.

Thus, the high frequency PN sequence generators and associated scramblers use frequency extension to produce PN sequences and spread the encoded data. The PN sequence generator uses a reference clock signal produced by the frequency extender/multiple clock generator 100 and produces PN sequences as described above. The scramblers take this PN sequence, the encoded data from the convolutional encoder 400, and control data ((1 data channel, 1 control channel)=(I,Q)) and produces the complex chips to be transmitted.

Convolutional Encoder

The convolutional encoder 400 described above is illustrated in greater detail in FIG. 9. This embodiment of the convolutional encoder 400 uses frequency extension concepts as described above to encode bits for transmission. The encoder receives a reference clock signal $F_{REF}$ at frequency extending multiple clock generator 100 and produces higher frequency clock pulses CLOCK 1, CLOCK 2, through CLOCK N in the same manner as described above. The convolutional encoder 400 uses a linear shift register 450 that receives the data bits to be transmitted. The high frequency clock pulse is appropriately combined with the data bits passing through the shift register 450 (state bits) using combinational logic to produce a time packed convolutionally encoded signal. This signal contains the encoded bits to be transmitted.

Figure 9:
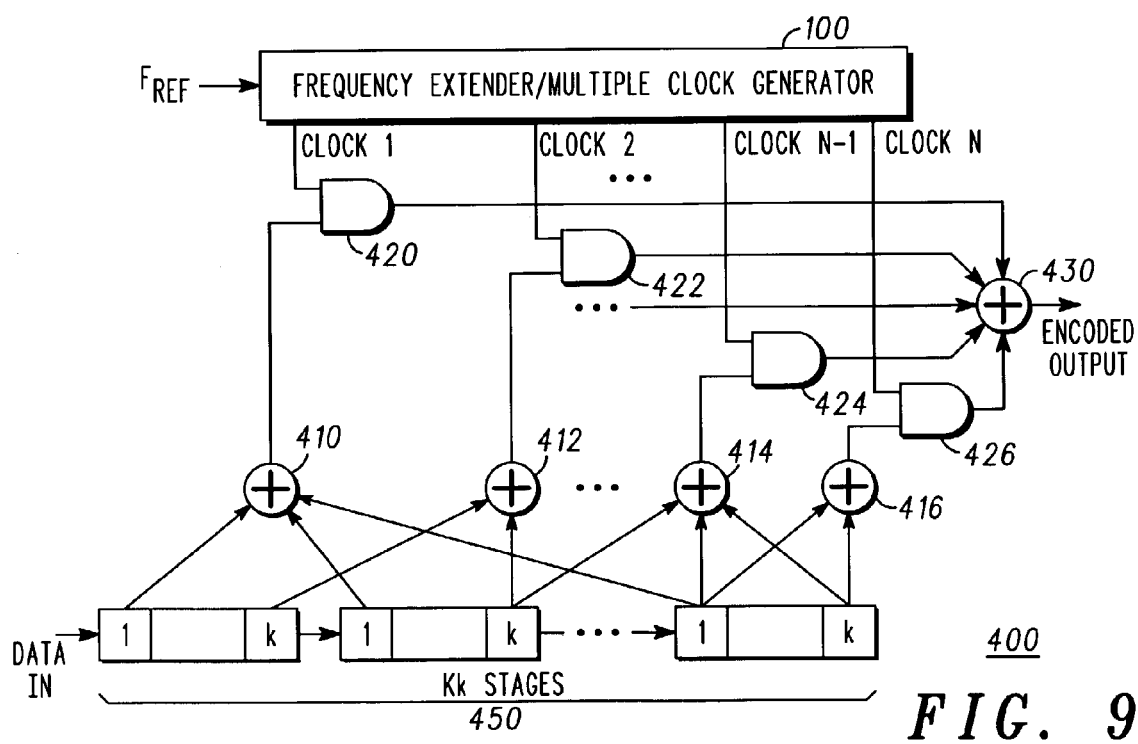
FIG. 9 is a circuit diagram of a convolutional encoder as used in FIG. 8 and consistent with certain embodiments of the present invention.

Referring to FIG. 9, the high frequency convolutional encoder contains a shift register 450 having K (k-bit) stages and N adders 410,412 through 414,416. The binary input data into the encoder is shifted into (and along) the shift register 450 k bits at a time. Hence the code rate is defined as R=k/N. The parameter K is defined as the constraint length. In general, the convolutional encoder 400 can produce the encoded output by combining the data bits passing through shift register 450 in an arbitrary manner defined by the convolutional code (air interface) specification at hand. This is depicted in FIG. 9 as arbitrary connections from the shift register cells to a plurality of adders 410, 412 through 414 and 416. The output of each of N adders (e.g., XOR gates) is then combined at AND gates 420, 422, through 424 and 426 respectively with clock signals CLOCK 1, CLOCK 2, through CLOCK N-1 and CLOCK N respectively. The outputs of AND gates 420, 422, through 424 and 426 are then combined at adder 430 to produce the encoded output. The encoded output is a time packed encoded sequence. For those skilled in the art, it is easily seen that this process of time packing an encoded bit sequence can be extended to "pack" several encoded output bits at one time. For example, the shift register 450 can be extended in length with more adders (410 through 416) to produce L*N code outputs at one time, where L>1. The frequency extender 100 can generate L*N clock pulses so that the output of the L*N adders is-combined with the L*N clock pulses to generate L time packed code outputs.

Thus, a convolutional encoder, consistent with certain embodiments of the present invention has a frequency extended multiple clock generator receiving a reference clock input signal and generating a plurality of N extended clock signals CLOCK 1 through CLOCK N therefrom. A linear shift register receives input data bits to be transmitted, the shift register having M outputs at M memory cells in the linear shift register. A combinational logic circuit combines the N extended clock signals with the K outputs of the linear shift register to produce a convolutionally encoded data sequence as an output thereof.

CONCLUSION

Thus, certain exemplary embodiments of the invention as depicted in the circuitry described above uses the concept of frequency extension to carry out high speed processing with minimal current drain. For example, the concept of frequency extension can be used to extend a reference clock signal by speeding it up (for example taking a 500 MHZ clock signal and creating a 2 GHz clock signal). Frequency extension is accomplished using one or multiple delay lines and combinational logic to produce an extended (high) frequency clock pulse. With this extended clock signal (or signals), various signal processing functions can be carried out at a much higher rate. By way of example, the circuitry as described above can be used to realize a correlator to provide chip level CDMA processing. Similarly, frequency extension can be used to encode bits in a convolutional encoder (symbol level processing). Together these circuits can be used to realize substantial portions of a CDMA transceiver that uses frequency extension, with an associated low level of current drain. By use of the current frequency extension concepts, descramblers and accumulators can run at a lower clock rate (e.g. reference clock rate) while architecture processes data at the extended frequency produced by the multiple clock generator, thus minimizing current drain. Moreover, the resulting circuitry, in certain embodiments, provides increased processing capability since the architecture correlates data at delay line rate (frequency extended rate). The multiple clock generator circuit can be used in multiple circuits to produce relatively low circuit complexity.

The present invention can be utilized in digital signal processing chips to provide chip level processing, and may be useful in systems that requires chip level signal processing. Exemplary applications include, but are not limited to cellular telephone base stations (CDMA air interfaces) and cellular handsets (CDMA air interfaces).

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A frequency extension circuit, comprising:
    a first delay line having a plurality of taps, and receiving a reference clock at an input thereof, wherein the reference clock has a clock rate of $F_{REF}$, and wherein the first delay line is situated within a feedback loop of a delay locked loop and thereby locked to $F_{REF}$ with a total delay of the first delay line being adjusted under feedback control from the delay locked loop;
    a second delay line having a plurality of taps, and receiving the reference clock at an input thereof; and
    a logic circuit that combines signals from the delay line taps of the first delay line with signals from the delay line taps of the second delay line such that the $n^{th}$ tap of the first delay line is combined with the n-$1^{st}$ tap of the second delay line for each of a plurality of N taps in the first delay line,
    wherein the logic circuit produces, as an output thereof, a collection of clock pulses having a clock rate of multiples of $F_{REF}*N$.

2. The frequency extension circuit according to claim 1, wherein the logic circuit comprises a plurality of N EXCLUSIVE OR gates each having a first input connected to the $n^{th}$ tap of the first delay line and having a second input connected to the n-$1^{st}$ tap of the second delay line for each of a plurality of N taps in the first delay line and producing at an output thereof one of N pulses that collectively form a collection of clock pulses having a clock rate of multiples of $F_{REF}*N$.

3. The frequency extension circuit according to claim 1, wherein the second delay line is locked to $F_{REF}$ in a delay locked loop.

4. The frequency extension circuit according to claim 1, wherein the first delay line is locked to $F_{REF}$ in a delay locked loop, and wherein delays in the second delay line are controlled by the delay locked loop.

5. The frequency extension circuit according to claim 1, wherein the first delay line comprises a sequence of series connected buffers.

6. The frequency extension circuit according to claim 1, wherein the second delay line comprises a sequence of series connected buffers.

7. A frequency extension circuit, comprising:
    a first delay line having a plurality of taps, and receiving a reference clock at an input thereof, wherein the reference clock has a clock rate of $F_{REF}$, and wherein the first delay line is situated within a feedback loop of a delay locked loop and thereby locked to $F_{REF}$ with a total delay of the first delay line being adjusted under feedback control from the delay locked loop;
    a second delay line having a plurality of taps, and receiving the reference clock at an input thereof, wherein the second delay line is locked to $F_{REF}$ in a delay locked loop; and
    a logic circuit that combines signals from the delay line taps of the first delay line with signals from the delay line taps of the second delay line such that the $n^{th}$ tap of the first delay line is combined with the n-$1^{st}$ tap the second delay line for each of a plurality of N taps in the first delay line,
    wherein the logic circuit produces, as an output thereof, a collection of clock pulses having a clock rate of multiples of $F_{REF}*N$.

8. The frequency extension circuit according to claim 7, wherein the logic circuit comprises a plurality of N EXCLUSIVE OR gates each having a first input connected to the $n^{th}$ tap of the first delay line and having a second input connected to the n-$1^{st}$ tap of at least one of the second and first delay line for each of a plurality of N taps in the first delay line and producing at an output thereof one of N pulses that collectively form a collection of clock pulses having a clock rate of multiples of $F_{REF}*N$.

9. The frequency extension circuit according to claim 7, wherein the first delay line comprises a sequence of series connected buffers.

10. The frequency extension circuit according to claim 7, wherein the second delay line comprises a sequence of series connected buffers.

11. The frequency extension circuit according to claim 9, wherein the second delay line comprises a sequence of series connected buffers.

12. The frequency extension circuit according to claim 5, wherein the second delay line comprises a sequence of series connected buffers.

* * * * *